United States Patent
Esmaily et al.

(10) Patent No.: US 10,763,606 B1
(45) Date of Patent: Sep. 1, 2020

(54) CONTAMINATION PROTECTION FOR MODULE AND CONNECTOR INTERFACE IN A NETWORK DEVICE

(71) Applicant: CISCO TECHNOLOGY, INC., San Jose, CA (US)

(72) Inventors: Kamran Esmaily, Sunnyvale, CA (US); Mandy Hin Lam, Fremont, CA (US); Ravi Eda, Milpitas, CA (US); Robert Gregory Twiss, Chapel Hill, NC (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/550,167

(22) Filed: Aug. 23, 2019

(51) Int. Cl.
*H01R 12/73* (2011.01)
*H01R 13/52* (2006.01)

(52) U.S. Cl.
CPC ....... *H01R 12/737* (2013.01); *H01R 13/5219* (2013.01)

(58) Field of Classification Search
CPC ............................ H01R 12/737; H01R 13/5219
USPC ..................................................... 439/65, 637
See application file for complete search history.

(56) References Cited

U.S. PATENT DOCUMENTS

| | | | | |
|---|---|---|---|---|
| 3,475,657 A | * | 10/1969 | Knowles | H01R 23/68 361/787 |
| 3,529,213 A | * | 9/1970 | Farrand | H01L 23/5385 361/730 |
| 5,060,113 A | * | 10/1991 | Jacobs | H05K 7/1461 361/721 |
| 5,539,620 A | * | 7/1996 | Gale | H01R 23/6873 361/800 |
| 5,648,891 A | * | 7/1997 | Gierut | H05K 1/142 361/740 |
| 7,106,595 B2 | * | 9/2006 | Foster, Sr. | G06F 1/185 165/80.3 |
| 7,165,898 B2 | | 1/2007 | Kato | |
| 7,544,252 B1 | | 6/2009 | Scea | |
| 7,619,893 B1 | * | 11/2009 | Yu | H01L 23/3672 165/185 |
| 8,018,723 B1 | * | 9/2011 | Yu | H01L 23/367 257/707 |
| 8,385,080 B2 | * | 2/2013 | Kim | H05K 7/00 361/760 |
| 9,332,674 B2 | | 5/2016 | Campbell | |
| 9,746,879 B2 | | 8/2017 | Clayton | |
| 10,249,555 B2 | | 4/2019 | Campbell | |

(Continued)

FOREIGN PATENT DOCUMENTS

| | | |
|---|---|---|
| CN | 109144187 A | 1/2019 |
| KR | 100731730 B1 | 6/2007 |

(Continued)

*Primary Examiner* — Harshad C Patel
(74) *Attorney, Agent, or Firm* — Cindy Kaplan

(57) ABSTRACT

In one embodiment, an apparatus includes a frame for attaching to a module with contacts of the module exposed for mating with a connector operable to couple the module to a printed circuit board, the frame comprising a seal for positioning on opposing faces of the module adjacent to the contacts to protect a module to connector interface from contaminants passing through a network device with the module installed in the network device.

20 Claims, 9 Drawing Sheets

(56) References Cited

U.S. PATENT DOCUMENTS

2009/0168374 A1     7/2009   Clayton
2010/0254096 A1* 10/2010   Kim .................... G06F 1/185
                                                                          361/737

FOREIGN PATENT DOCUMENTS

KR      20080063911 A     7/2008
WO       2010005435 A1     1/2010

* cited by examiner

US 10,763,606 B1

CONTAMINATION PROTECTION FOR MODULE AND CONNECTOR INTERFACE IN A NETWORK DEVICE

TECHNICAL FIELD

The present disclosure relates generally to network devices in a communications network, and more particularly, to corrosion protection for components in a network device.

BACKGROUND

Network communications systems utilize network devices that include complex and sensitive electronic components. The network devices are typically designed to operate in a controlled environment such as data centers and central offices with controlled temperature, humidity, and air quality. However, network equipment is being deployed closer to a user base and deployments are often exposed to non-protected outdoor environments. Network devices deployed in uncontrolled remote areas with high humidity, salt fog, hygroscopic dust, and other contaminants in the air often exhibit severe corrosion problems, which may reduce the operational life of the equipment or FRUs (Field Replaceable Units) within the equipment.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1:
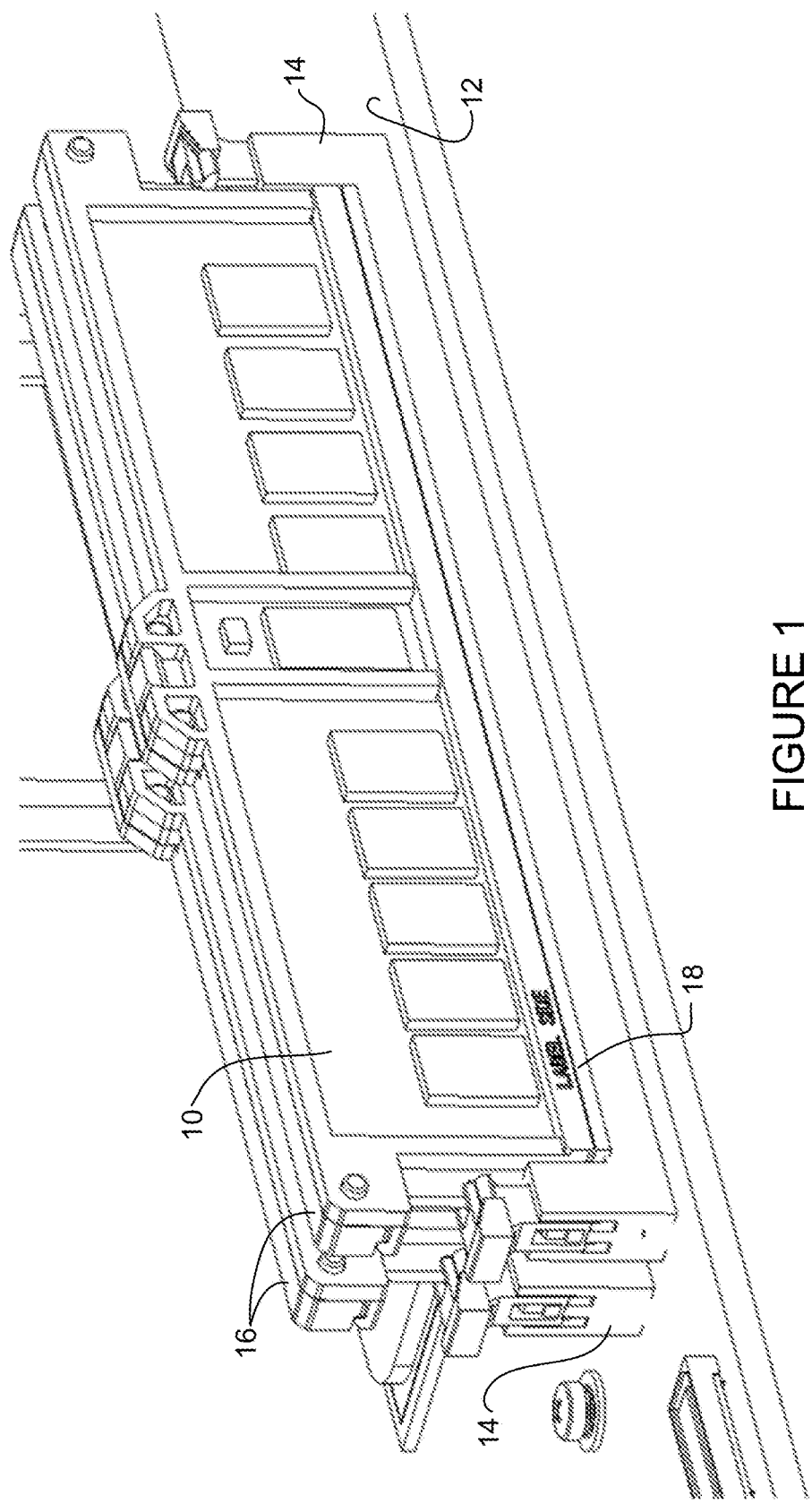
FIG. 1 is a perspective of a plurality of memory modules and connectors on a printed circuit board with frames attached to the memory modules to protect a module to connector interface from contamination, in accordance with one embodiment.

In one embodiment, an apparatus generally comprises a frame for attaching to a module with contacts of the module exposed for mating with a connector operable to couple the module to a printed circuit board, the frame comprising a seal for positioning on opposing faces of the module adjacent to the contacts to protect a module to connector interface from contaminants passing through a network device with the module installed in the network device.

In one or more embodiments, the frame is connected to at least a portion of a periphery of the module.

In one or more embodiments, the frame exposes chips installed on the module.

In one or more embodiments, the module comprises a memory module and the connector is configured for receiving the module positioned 180 degrees from the printed circuit board.

In one or more embodiments, the frame comprises a plastic frame and the seal comprises a foam material.

In one or more embodiments, the frame comprises an aluminum frame and the seal comprises a thermal pad.

In one or more embodiments, the frame comprises a two piece frame, each of the pieces of the frame attached to one of the opposing faces of the module.

In one or more embodiments, the two pieces of the frame are snap fitted to one another.

In one or more embodiments, the seal comprises sealing elements extending longitudinally along an edge of each of the two pieces of the frames.

In one or more embodiments, the frame is rectangular in shape and comprises a stiffening rib.

In another embodiment, an apparatus generally comprises a module comprising contacts for mating with contacts on a connector, the connector operable to couple the module to a printed circuit board and a frame attached to the module with the contacts of the module exposed for mating with the connector, the frame comprising a seal positioned on opposing faces of the module adjacent to the contacts of the module to protect a module to connector interface from contaminants passing through a network device with the module installed in the network device.

In yet another embodiment, an apparatus generally comprises a module comprising contacts, a printed circuit board, a connector connected to the printed circuit board and comprising contacts mating with the contacts of the module and coupling the module to the printed circuit board, and a frame attached to the module with the contacts of the module mating with the contacts of the connector, the frame comprising a seal protecting the contacts from contamination when the module is inserted into the connector.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network communications devices are increasingly being used in uncontrolled environments that have different conditions than a data center or central office. In many of these deployments, the network device has no environmental protection and is directly exposed to ambient air. Based on the climatic conditions of the area, the ambient air may not only carry a lot of dust and moisture, but also different chemical compounds. The network device may be subjected to adverse environmental factors including temperature and humidity extremes, airborne particulates, chemical pollutants, and other contaminants. The environment in which the network device operates may not be conducive to prolonged operation and life of the equipment.

Although all types of outdoor equipment face corrosion issues, the severity of the failure is typically higher for air cooled devices due to the flow of contaminated air within equipment enclosures. In an air cooled network device, the composition of the air may react with metal used in electronic components and cause corrosion. Deployment of network devices in the presence of uncontrolled contamination in cooling air (e.g., dust, moisture, abrasive chemicals, water soluble salts, etc.), may lead to damage to FRUs (Field Replaceable Units). For example, routers, switches, and other network devices that are deployed in uncontrolled remote areas with high humidity, salt fog, high hygroscopic dust, or other contaminants in the air are highly susceptible to corrosion, which may drastically reduce the operational life of the entire unit or its FRUs. Failure of the network device or components may occur very quickly in an uncontrolled environment. These failures are not predictable and therefore create service interruption and high costs for replacement units. Since these failures are often not recoverable, the downtime associated with these failures may be significant.

In order to simulate what the equipment may experience over time and evaluate resistance to corrosion due to gases in the atmosphere, network equipment may be exposed to mixed flow gas tests. Mixed flow gas testing may expose the equipment to coarse dust particles, sulfide, ammonia, oxides of nitrogen, ozone, and gaseous chlorine, or other contaminants while varying temperature, relative humidity, concentration of gaseous pollutants, and other critical variables (e.g., volume exchange rate and airflow rate). In order to pass these tests and increase equipment life, components within the network device often need corrosion protection.

One method for protecting components from corrosion is a conformal coating process that coats a printed circuit board with a thin film for protection of surface mounted components from corrosion. However, when the conformal coating is applied, reworking of components becomes difficult and compromises the conformal coating. For devices such as memory modules or other components that are coupled to the printed circuit board through a connector, the area around the connector cannot be coated. For example, conformal coating may not be used to protect internal connector contacts such as card connections within a socket.

The embodiments described herein provide a frame (module frame, sealing frame, corrosion prevention frame, contamination protection frame) to protect exposed contacts (e.g., pins, fingers, gold fingers, pads, leads, copper leads, wires) at a connector to module interface for preventing (reducing, delaying) corrosion of the contacts. As described in detail below, the frame is attached to a module and includes a seal (sealing member, sealing elements) adjacent to the module contacts to protect the module to connector interface (socket connection compartment) from contaminants (e.g., dust, salt fog, moisture, or other chemicals). The frame may be used, for example, to protect pins of a socket and contact fingers of a memory module that are not suitable for coating to help improve their durability when network devices are deployed in harsh environments.

As described in detail below, in one or more embodiments, an apparatus comprises a frame for attaching to a module with contacts of the module exposed for mating with a connector operable to couple the module to a printed circuit board. The frame comprises a seal positioned on opposing faces of the module adjacent to the module contacts to protect a module to connector interface from contaminants passing through a network device with the module installed in the network device.

It is to be understood that the term "module" as used herein may refer to any card, memory device, or other element coupled to a printed circuit board through a connector. The term "connector" as used herein may refer to a socket, receptacle, port, or other interface operable to couple the module to the printed circuit board. As described in detail below, contacts (pins, leads, contact members, fingers, gold fingers, pads, wires, copper elements) of the module and connector may be exposed to environmental conditions when installed on the printed circuit board in the network device.

The term "frame" as used herein refers to a structural member configured to support sealing elements and position the sealing elements on the module to protect exposed contacts (e.g., contacts at the module to connector interface) and prevent (e.g., delay, reduce, or prevent) corrosion of the contacts. The seal provides a barrier between cooling air and the contacts to protect the contacts from moisture or contaminants that may be present in cooling air flowing over the components. The frame may be a continuous member that extends around a periphery of the module (e.g., upper edges or margins and lower edge margin of module) as described below or may be an open (discontinuous) structure extending over only a portion of the module.

It is to be understood that the terms upper, lower, top, bottom, and the like as used herein are relative terms based on orientation of the board or network device and are provided as examples and not to be interpreted as limiting the orientation, arrangement, or layout of components.

Referring now to the drawings, and first to FIG. 1, memory modules (e.g., DIMMs (Dual In-line Memory Modules)) 10 are coupled to a printed circuit board (PCB) 12 through connectors (module connectors) 14. A frame 16 is mounted on the module 10 and comprises a seal 18 operable to create a barrier to prevent entry of contaminants at the module to connector interface with the module inserted into the connector 14. The seal 18 may comprise, for example, a resilient compressible foam material that seals against a surface of the connector 14 when the module 10 and attached frame 16 are inserted into the connector.

In the example shown in FIG. 1, the modules 10 are installed vertically (e.g., 180 degrees relative to the PCB 12, generally perpendicular to the PCB) and the connector may be referred to as a 180 degree connector. The module 10 may also be inserted at an angle (e.g., 90 degrees or any other angle) relative to the PCB 12. The PCB 12 may comprise any number of components (chips, memory, processors, power supplies, etc.) arranged in any format. One or more modules coupled to the PCB 12 through a connector may have a contamination protection frame attached in accordance with the embodiments described herein.

Figure 2:
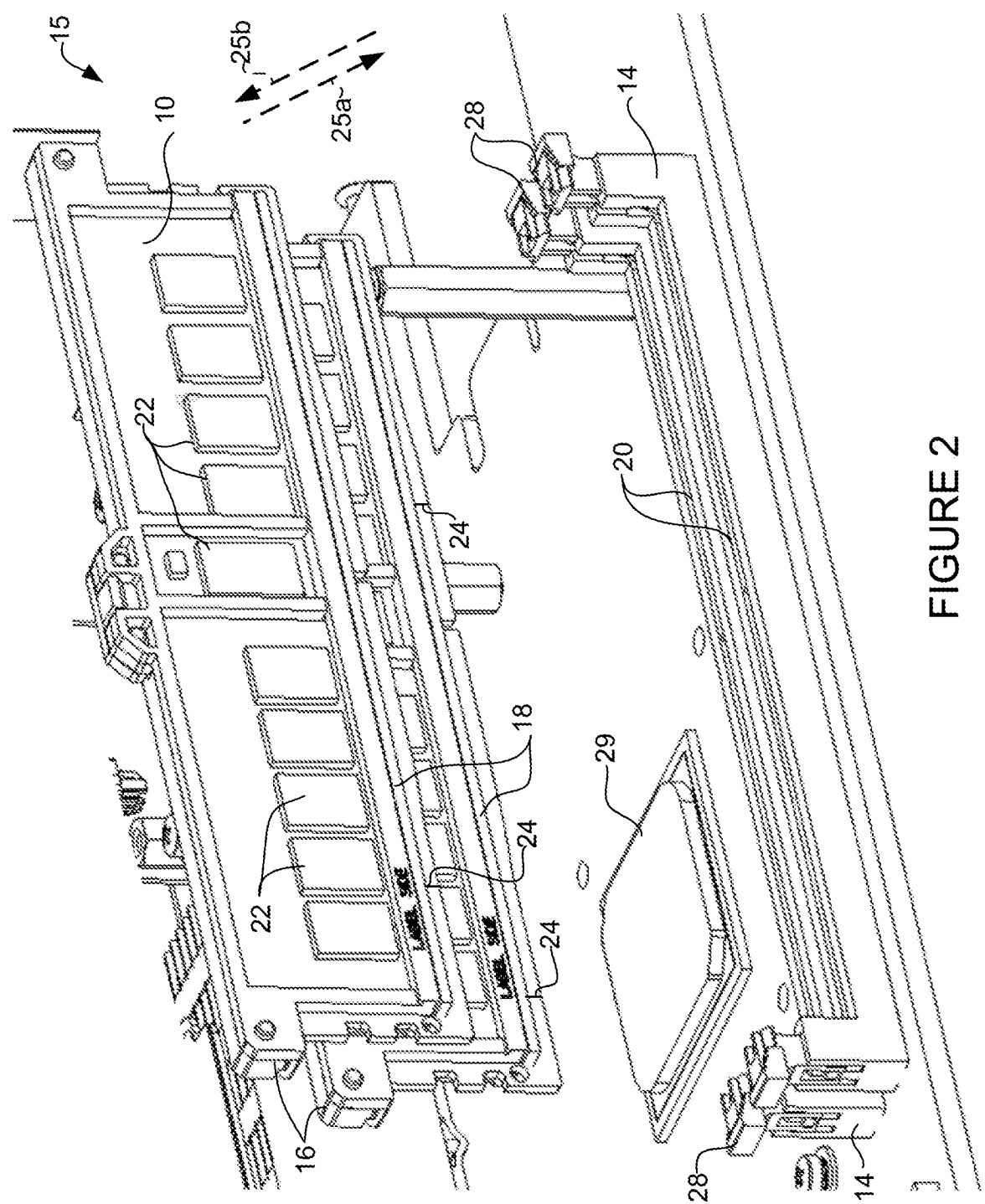
FIG. 2 is an exploded perspective of FIG. 1 showing the memory modules and frames removed from the connectors.

FIG. 2 is a perspective showing the modules 10 and attached frames 16 removed from the connectors 14. The connector 14 comprises a slot 20 for receiving a lower edge portion of the module 10. Internal to the slot 20 are a plurality of leads for electrical coupling of the module to the PCB 12 through the connector 14. In the example shown in FIGS. 1 and 2, the memory module 10 comprises a plurality of chips 22 (e.g., DRAM (Dynamic Random Access Memory) integrated circuits) and contacts (pins, fingers) 24 (only a few shown for simplification) for communication between the chips and the board 12 through the connector 14. The module 10 may comprise any number of chips 22 and contacts 24 (e.g., 288 pins for DIMM) on one or both sides (opposing faces) of the module. The contacts 24 of the module 10 are coupled with the PCB 12 through the leads on the connector 14. In the example shown in FIGS. 1 and 2, the connectors 14 comprise locking members 28 for securely retaining the memory module 10. As previously noted, the PCB 12 may comprise any number of other components (e.g., surface mounted chip 29 shown in FIG. 2).

FIGS. 1 and 2 illustrate a portion of a network device, generally indicated at 15, with a cover removed to show details. In one or more embodiments, the network device 15 is an air cooled device with one or more fans forcing air through the network device (e.g., from front-to-back, back-to-front, side-to-side). While the housing or cover of the network device may provide some protection of the components from contamination, the air flowing through the network device 15 (e.g., as indicated by arrow 25a or 25b) may carry water, salt, dust, or other contaminants. The seal 18 of the frame 16 protects the module to connector interface to prevent corrosion of the contacts of the module and connector.

Figure 3A:
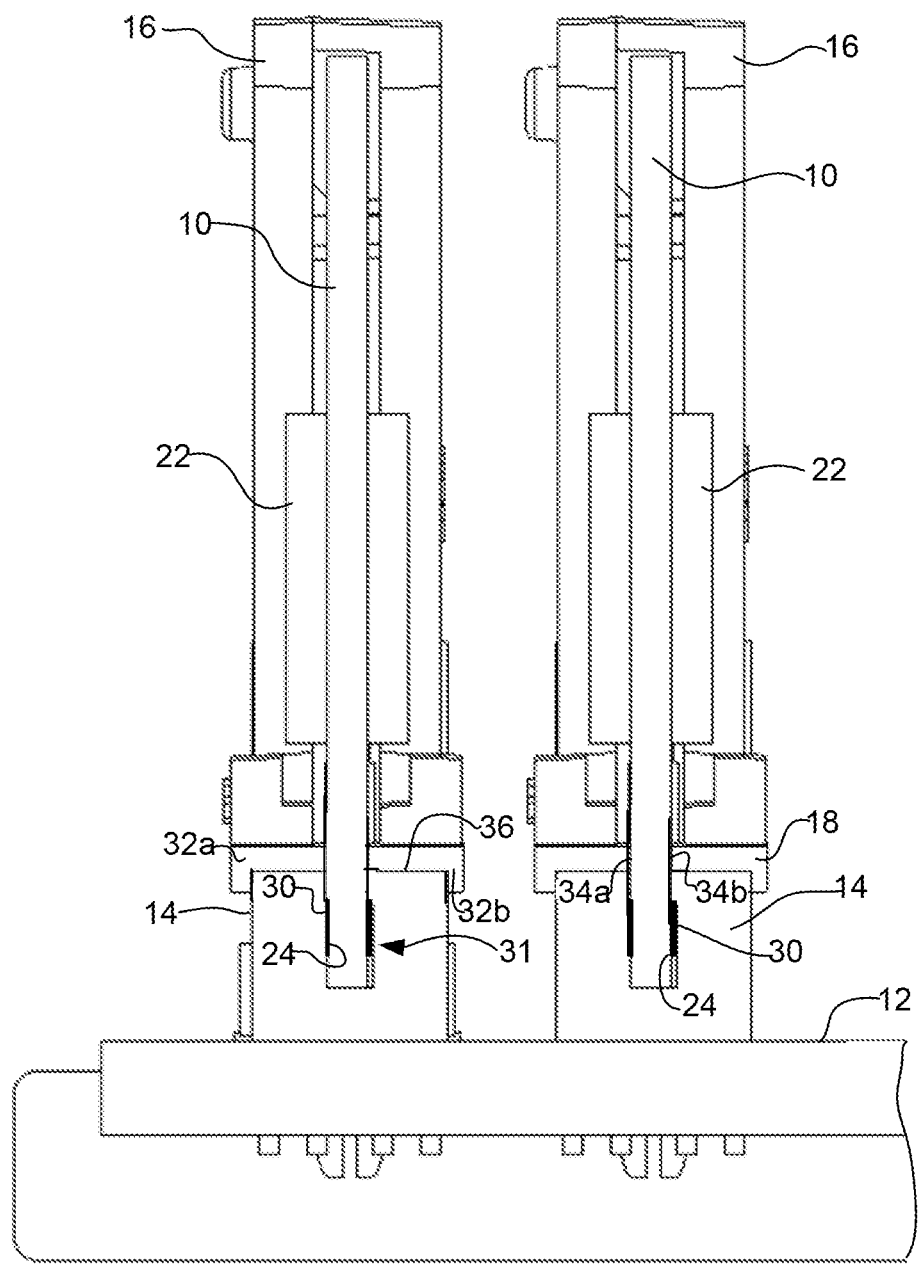
FIG. 3A is a cross-sectional view of the memory modules, frames and connectors shown in FIG. 1.

FIG. 3A is a cross-sectional view of the memory modules 10, connectors 14, and frames 16 shown in FIG. 1. Contacts 24 on the module 10 are aligned with contacts 30 on the connector at the module to connector interface, generally indicated at 31, to couple the module to the printed circuit board 12. The seal (sealing member) 18 comprises sealing elements 32a, 32b positioned on opposing faces 34a, 34b of the module 10 adjacent to the module contacts 24. The sealing elements 32a, 32b located adjacent to the contacts 24 may be offset slightly (e.g., spacing between contacts and sealing elements) to provide for manufacturing tolerances and prevent interference of the sealing elements with the contacts. The sealing elements 32a, 32b are compressed against an upper surface 36 of the connector 14 when the module 10 is inserted into the connector to create a seal and protect the module to connector interface (socket connection compartment) 31 from contaminants passing through the network device 15 with the module and connector installed in the network device (FIGS. 2 and 3).

Figure 3B:
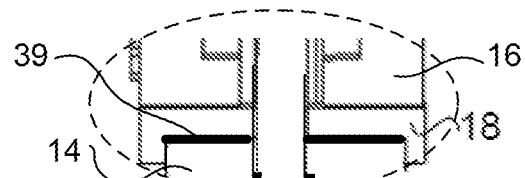
FIG. 3B is a partial view of the memory module, frame, and connector with a seal coating applied to a surface of the connector mating with the frame.

In one or more embodiments, a seal coating (e.g., secondary seal) may be applied to the upper surface 36 of the connector 14. As shown in FIG. 3B, a seal coating 39 is interposed between the seal 18 of the frame 16 and the connector 14. The contamination protection and corrosion prevention provided by the frame 16 is further enhanced by combining with a removable or 'strippable' sealant material (seal coating) 39. The coating 39 may be applied to the entire contact surface of the connector 14 as shown in FIG. 3B or only a portion of the contact surface and may also extend into the slot or side of the connector as long as the seal coating does not interfere with insertion of the module or coupling the of the contacts. In one or more embodiments, the seal coating 39 may comprise a fugitive adhesive or a strippable film.

A fugitive adhesive may have substantially the same adherent properties as an adhesive, however, it also possess the ability to be removed mechanically after application as a contiguous mass and not leave material residue. An example of such a fugitive adhesive is 3M™ Hot Melt Adhesive 3798LM. This particular material may be heated in an applicator "gun" and applied as a hot (e.g., approximately 250° F.) liquid. Once cooled, this adhesive retains an adherent "tacky" property, but it also can be mechanically peeled from surfaces if desired. One advantage of liquid application is that the adhesive will tend to flow readily into gaps, crevices, and voids, facilitating substantially complete filling or sealing of the target object. The cooled material may then serve as both an adhesive, effectively facilitating joining two or more parts, and as a barrier or sealant against moisture and fluids, particulate residue, and other air-borne contaminants.

A strippable film is a relatively thin (e.g., approximately 3-5 mils) polymeric film such as polyurethane, vinyl chlorides, or acrylic polymers mixed with other thickening and bonding agents. The film may be applied by brush or spray, for example. Once cured, the resultant film provides an environmental barrier that may peeled or stripped away when required.

In one or more embodiments, the seal coating may be applied directly to the frame 16 and form the seal of the frame. The seal coating may also be applied directly to the module 10 at a location adjacent to the contacts to provide additional sealing between the module and connector interface or at the seal to module interface before the module is inserted into the frame.

Figure 4:
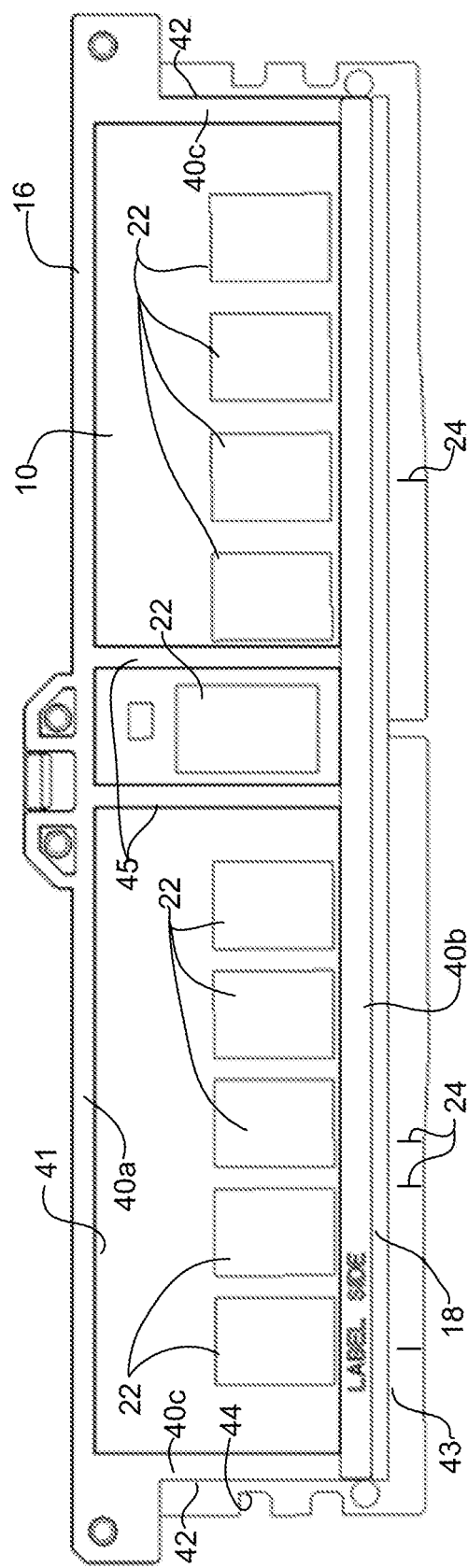
FIG. 4 is a front view of the memory module and frame of FIG. 1.

FIG. 4 is a front view of the module 10 and attached frame 16. In the example shown in FIG. 4, the frame 16 is generally rectangular shaped and comprises an upper edge 40a, lower edge 40b, and sides 40c, and extends around a periphery of the module 10 (upper edge 41, side edge margins 42 and lower edge margin 43 of module). The sides of the frame 16 are moved inward from the edge to expose grooves (notches, indents) 44 that engage with the locking members 28 of the connector 14 (FIGS. 2 and 4). The lower edge 40b of the frame 16 comprises the seal 18 positioned adjacent to the contacts 24 to allow the contacts to mate with the connector. As previously noted, only a few contacts 24 are shown on the module 10 for simplification. In one or more embodiments, the frame 16 may comprise one or more stiffening ribs 45 extending generally parallel to the sides 40c of the frame. The ribs 45 are positioned to prevent interference with the chips 22.

In one or more embodiments, the seal may be made of a foam material (e.g., high density 80 PPI (Pores Per Inch) filtration foam) having suitable chemical resistance and material stability over a specified temperature range corresponding to operating conditions of the module 10, board 12, and surrounding components, and filtration properties to prevent salt fog and gases from entering the socket connection compartment 31 (FIG. 3A). In one or more embodiments, the frame 16 may be formed from a plastic material (e.g., polypropylene) that is sufficiently robust but still flexible to easily adapt for attachment to both sides 34a, 34b of the module.

The example shown in FIG. 4 provides an open frame design to allow airflow cooling to the chips 22. In one or more embodiments, the frame 16 may comprise two metal plates (e.g., aluminum plates sized to cover at least a portion of each face of the module) to form a heat spreader and manufacturing protection shield. The seal may be formed from a thermal pad interface material.

Figure 5:
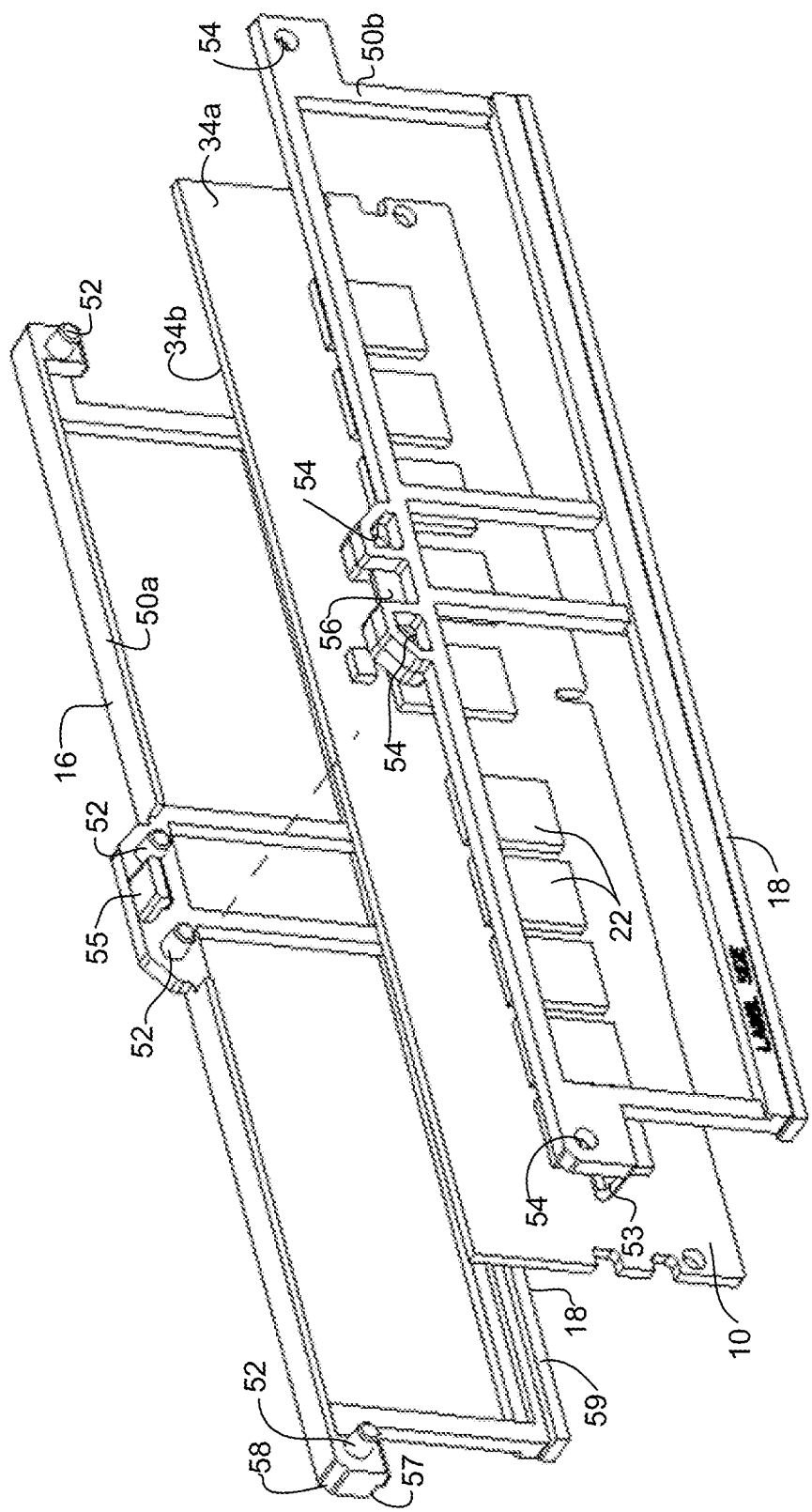
FIG. 5 is an exploded perspective of the memory module and frame of FIG. 4.

In one or more embodiments, the frame 16 comprises two pieces (first portion, second portion) 50a, 50b (FIG. 5). FIG. 5 illustrates an exploded view of the two portions 50a, 50b of the frame 16 and the module 10 interposed therebetween. In this example, the frame 16 comprises a plurality of locking and alignment pins (fingers, tabs) and keys. The first portion 50a of the frame 16 comprises alignment pins 52 for insertion into openings 54 on the second portion 50b of the frame. The first portion 50a also comprises a key 55 that snaps into notch 56 on the second portion 50b of the frame. The second portion 50b of the frame comprises keys 53 that snap into notches 57 on the first portion 50a to securely connect the two portions of the frame with the module 10 interposed therebetween.

In one or more embodiments, the seal 18 may comprise an adhesive to ensure proper sealing between the seal and the module face 34a, 34b. For example, an adhesive may be applied to an inner surface of the seal 18 and a protective liner 59 applied (FIG. 5). The liner is removed before the module 10 is positioned on the frame.

Figure 6:
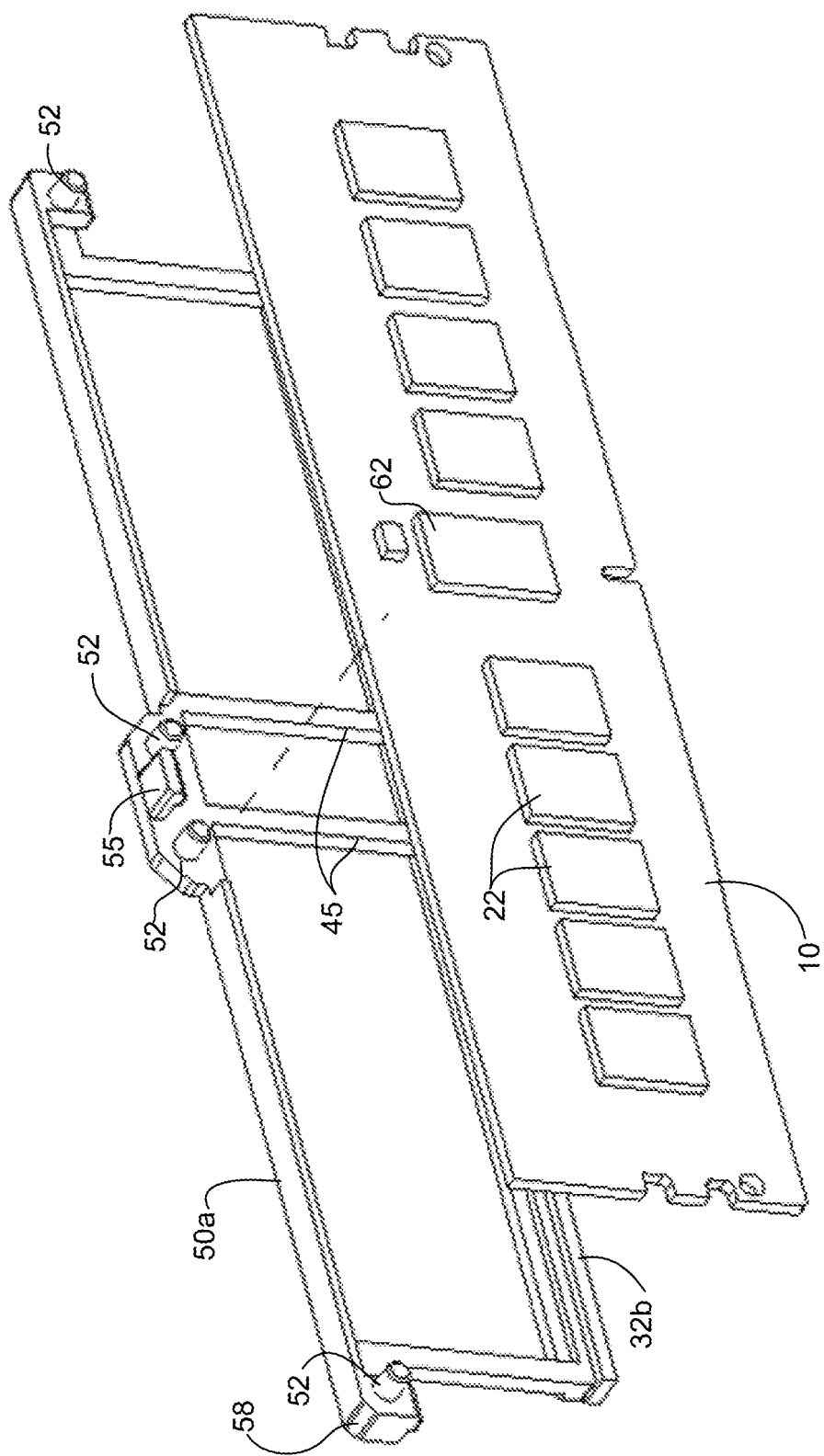
FIG. 6 is an exploded perspective of the memory module and a first portion of the frame.

FIG. 6 illustrates a first step in a process for assembling the frame 16 and module 10, in accordance with one embodiment (FIGS. 5 and 6). The liner 59 (FIG. 5) is removed from the sealing element 32b on the first portion 50a of the frame. The module 10 is aligned with the first portion 50a of the frame such that center chip 62 is located between the two ribs 45 of the frame. In one or more embodiments, the frame may include an indicator for proper alignment of the module 10 to the frame. For example, one corner 58 of the first portion 50a of the frame may have a chamfer to identify a side in which the portion of the module containing five chips 22 should be located.

Figure 7:
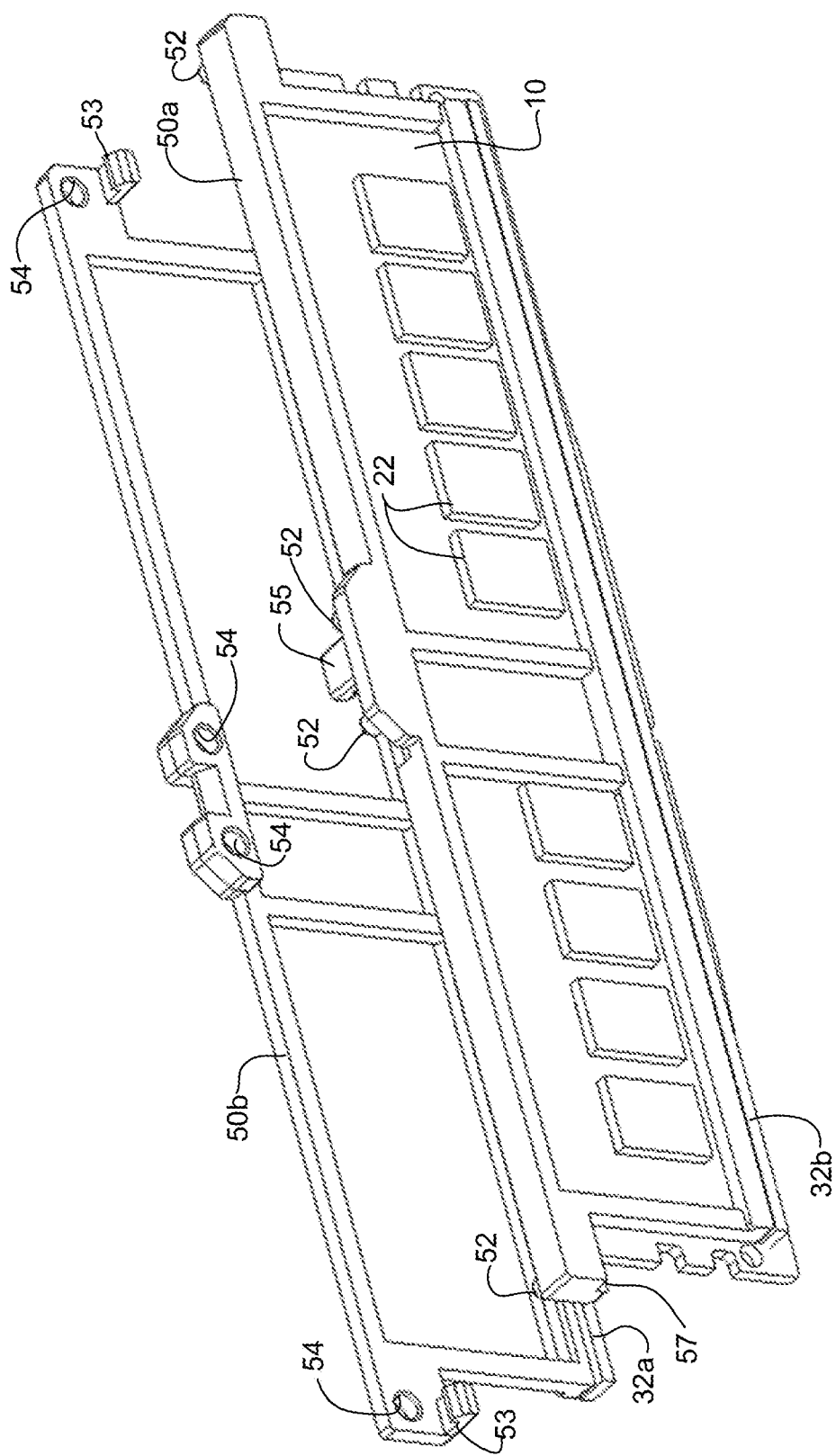
FIG. 7 is an exploded perspective of a second portion of the frame and the memory module coupled to the first portion of the frame.
Figure 8:
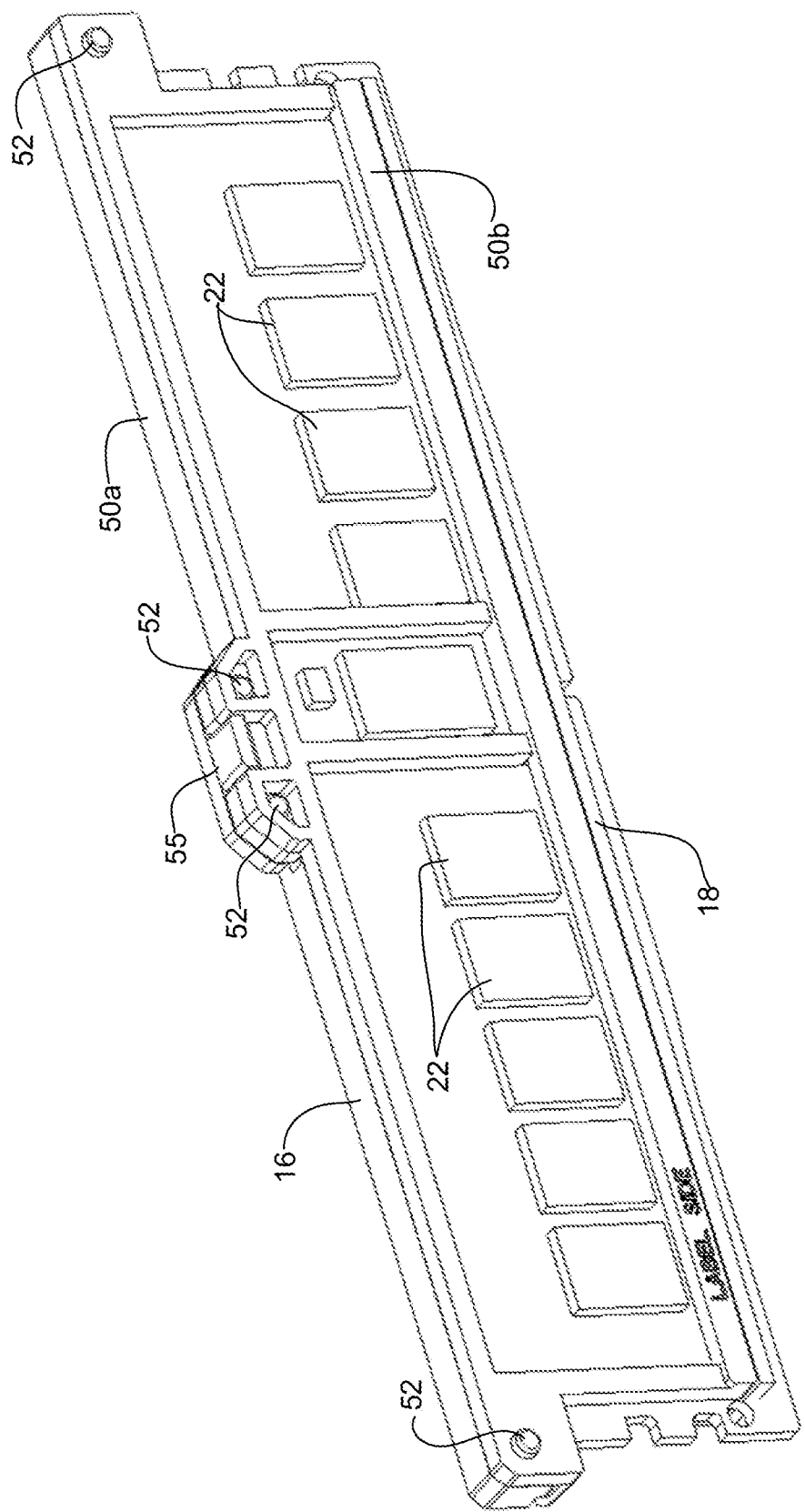
FIG. 8 is a perspective of the memory module installed in the frame.

FIG. 7 illustrates a second step in which the second portion 50b of the frame is coupled to the first portion 50a of the frame attached to the module 10. A liner may be removed from the adhesive area of the seal element 32a as previously described and the second portion 50b of the frame aligned with the first portion 50a of the frame. All four alignment pins 52 are inserted into their mating holes 54 and each key 53, 55 is clicked in place to snap the frame pieces 50a, 50b firmly together. The completed frame 16 and module 10 are shown in FIG. 8 with the two frame portions 50a, 50b mated to opposite faces of the module 10. The module 10 may then be inserted into the connector 14 (FIGS. 1-3) with the seal 18 compressed against the connector 14 to form a generally sealed mating surface to protect the module and connector interface from contamination and prevent corrosion of the module and connector contacts.

It is to be understood that the frame 16 and module 10 described above and shown in FIGS. 1-8 is only an example and that other types of modules may be used with the frame configured to mate with the shape and size of the module and seal against the connector. Also as previously noted, the frame may extend only partially around the module and may be any structure that supports the seal and maintains the seal in contact with the connector to prevent contaminants from entering the module to connection interface.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. The network devices may communicate over or be in communication with one or more networks, which may include any number or arrangement of network communications devices (e.g., switches, access points, routers, or other devices) operable to route (switch, forward) data communications.

Figure 9:
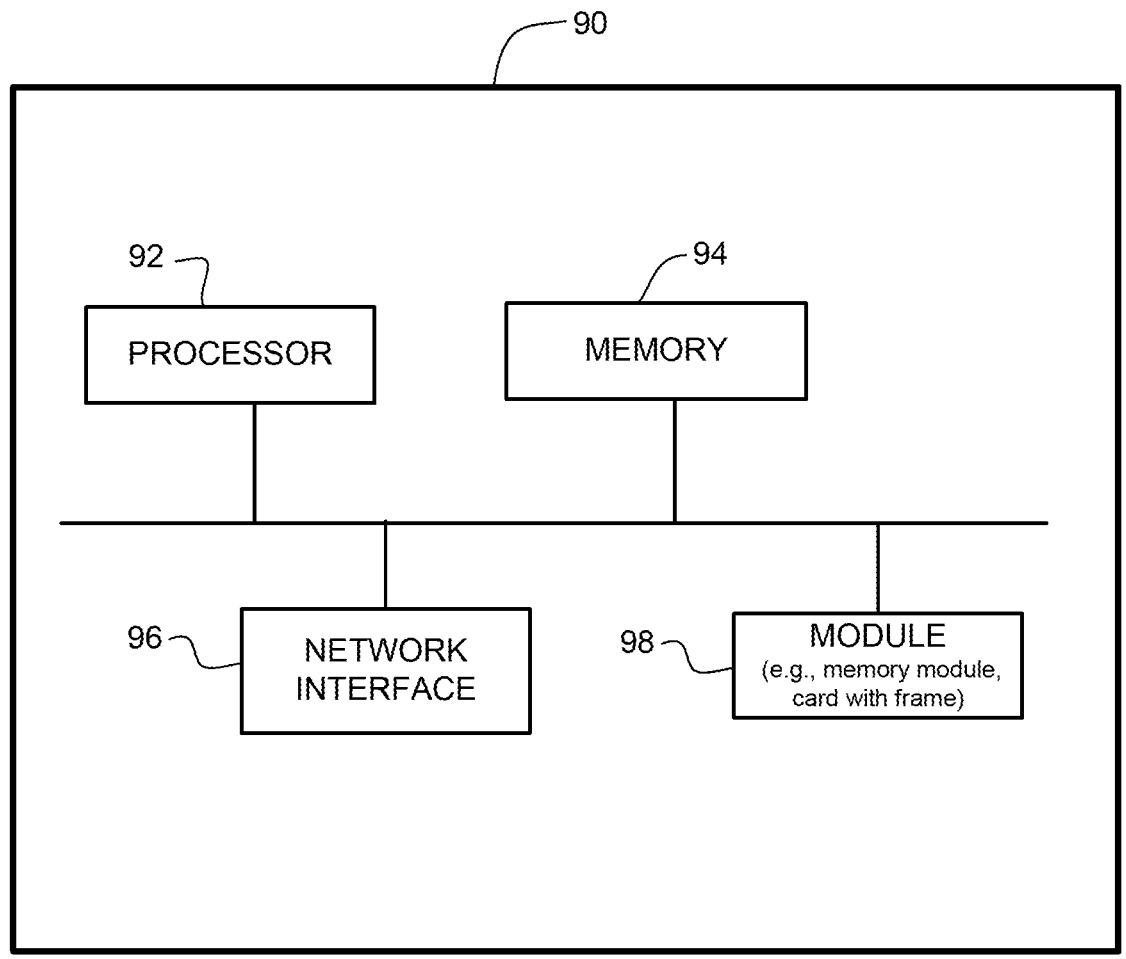
FIG. 9 is a block diagram depicting an example of a network device in which the embodiments described herein may be implemented.

FIG. 9 illustrates an example of a network device 90 that may implement the embodiments described herein. In one or more embodiments, the network device 90 is a programmable machine that may be implemented in hardware, software, or any combination thereof. The network device 90 includes one or more processor 92, memory 94, network interface (port) 96, and module (e.g., card, memory module, and the like) 98 with attached frame.

Memory 94 may be a volatile memory or non-volatile storage, which stores various applications, operating systems, modules, and data for execution and use by the processor 92. Memory 94 may include on or more of the modules 98. The network device 90 may include any number of memory components, including for example, any number of memory modules (e.g., DIMMs) that are protected from contamination using the contamination protection frame described herein.

Logic may be encoded in one or more tangible media for execution by the processor 92. For example, the processor 92 may execute codes stored in a computer-readable medium such as memory 94. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 90 may include any number of processors 92.

The network interface 96 may comprise any number of interfaces (line cards, ports) for receiving data or transmitting data to other devices.

It is to be understood that the network device 90 shown in FIG. 9 and described above is only an example and that different configurations of network devices may be used. For example, the network device 90 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a module; and
   a frame for attaching to the module with contacts of the module exposed for mating with a connector operable to couple the module to a printed circuit board, the frame comprising a seal for positioning on opposing faces of the module adjacent to the contacts to protect a module to connector interface from contaminants passing through a network device with the module installed in the network device.

2. The apparatus of claim 1 wherein the frame is connected to at least a portion of a periphery of the module.

3. The apparatus of claim 1 wherein the frame exposes chips installed on the module.

4. The apparatus of claim 1 wherein the module comprises a memory module and the connector is configured for receiving the module positioned 180 degrees from the printed circuit board.

5. The apparatus of claim 1 wherein the frame comprises a plastic frame and the seal comprises a foam material.

6. The apparatus of claim 1 wherein the frame comprises an aluminum frame and the seal comprises a thermal pad.

7. The apparatus of claim 1 wherein the frame comprises a two piece frame, each of said pieces of the frame attached to one of said opposing faces of the module.

8. The apparatus of claim 7 wherein said two pieces of the frame are snap fitted to one another.

9. The apparatus of claim 7 wherein the seal comprises sealing elements extending longitudinally along an edge of each of said two pieces of the frames.

10. The apparatus of claim 1 wherein the frame is rectangular in shape and comprises a stiffening rib.

11. An apparatus comprising:
a module comprising contacts for mating with contacts on a connector, the connector operable to couple the module to a printed circuit board; and
a frame attached to the module with the contacts of the module exposed for mating with the connector, the frame comprising a seal positioned on opposing faces of the module adjacent to the contacts of the module to protect a module to connector interface from contaminants passing through a network device with the module installed in the network device.

12. The apparatus of claim 11 wherein the frame extends around at least a portion of a periphery of the module.

13. The apparatus of claim 11 wherein the frame exposes chips installed on the module.

14. The apparatus of claim 11 wherein the frame comprises a plastic frame and the seal comprises a foam material.

15. The apparatus of claim 11 wherein the frame comprises an aluminum frame and the seal comprises a thermal pad.

16. The apparatus of claim 11 wherein the frame comprises a two piece frame, each of said pieces attached to one of said opposing faces of the module.

17. An apparatus comprising:
a module comprising contacts;
a printed circuit board,
a connector connected to the printed circuit board and comprising contacts mating with the contacts of the module and coupling the module to the printed circuit board; and
a frame attached to the module with the contacts of the module mating with the contacts of the connector, the frame comprising a seal protecting the contacts of the connector and the module from contamination when the module is inserted into the connector.

18. The apparatus of claim 17 further comprising a seal coating applied to a surface of the connector and interposed between the seal of the frame and the connector.

19. The apparatus of claim 18 wherein the seal coating comprises a fugitive adhesive.

20. The apparatus of claim 18 wherein the seal coating comprises a strippable film.

\* \* \* \* \*